US010361679B2

(12) United States Patent
Takata

(10) Patent No.: US 10,361,679 B2
(45) Date of Patent: Jul. 23, 2019

(54) MULTIPLEXER

(71) Applicant: Murata Manufacturing Co., Ltd., Nagaokakyo-shi, Kyoto-fu (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 69 days.

(21) Appl. No.: 15/788,836

(22) Filed: Oct. 20, 2017

(65) Prior Publication Data
US 2018/0131349 A1    May 10, 2018

(30) Foreign Application Priority Data
Nov. 4, 2016    (JP) .................................. 2016-216201

(51) Int. Cl.
*H03H 9/72*    (2006.01)
*H03H 9/64*    (2006.01)

(52) U.S. Cl.
CPC .......... *H03H 9/725* (2013.01); *H03H 9/6476* (2013.01); *H03H 9/6483* (2013.01); *H03H 9/6489* (2013.01)

(58) Field of Classification Search
CPC ............. H03H 9/72; H03H 9/725; H03H 9/64
USPC ........................................ 333/133, 193, 195
See application file for complete search history.

(56) References Cited

U.S. PATENT DOCUMENTS

| | | | |
|---|---|---|---|
| 9,219,467 B2 * | 12/2015 | Inoue .................... | H03H 9/6433 |
| 9,246,533 B2 * | 1/2016 | Fujiwara ................. | H04B 1/40 |
| 9,559,661 B2 * | 1/2017 | Inoue .................... | H03H 9/6433 |
| 2009/0289741 A1 | 11/2009 | Ito | |
| 2012/0313724 A1 | 12/2012 | Tsurunari et al. | |
| 2013/0113576 A1 | 5/2013 | Inoue et al. | |
| 2017/0099043 A1 * | 4/2017 | Goto ...................... | H03H 9/64 |
| 2017/0331456 A1 * | 11/2017 | Ono .................... | H03H 9/02637 |
| 2017/0359051 A1 | 12/2017 | Urata | |
| 2018/0069529 A1 * | 3/2018 | Bi ......................... | H03H 9/725 |

(Continued)

FOREIGN PATENT DOCUMENTS

| | | |
|---|---|---|
| JP | 2006-014296 A | 1/2006 |
| JP | 2013-118611 A | 6/2013 |
| JP | 2013-157839 A | 8/2013 |

(Continued)

OTHER PUBLICATIONS

Official Communication issued in Japanese Patent Application No. 2016-216201, dated Mar. 19, 2019.

*Primary Examiner* — Dean O Takaoka
(74) *Attorney, Agent, or Firm* — Keating & Bennett, LLP

(57) ABSTRACT

A multiplexer includes a transmission filter and a reception filter that are connected to a common terminal, and a cancellation circuit that is connected to the common terminal and a node on a transmission path and that offsets a component in a certain frequency band flowing through the transmission filter. The cancellation circuit includes a capacitive element connected to the common terminal, and a longitudinally-coupled resonator including a first end connected to the capacitive element and a second end connected to the node with no capacitive element interposed therebetween. An impedance in a reception band when viewing the cancellation circuit from the common terminal side is higher than an impedance in the reception band when viewing the cancellation circuit from the node side.

15 Claims, 10 Drawing Sheets

(56) References Cited

U.S. PATENT DOCUMENTS

2018/0131348 A1* 5/2018 Takahashi .......... H03H 9/02992
2019/0058452 A1* 2/2019 Takata ............... H03H 9/02818

FOREIGN PATENT DOCUMENTS

| JP | 2014-171210 A | 9/2014 |
| WO | 2007-049699 A1 | 5/2007 |
| WO | 2011/061904 A1 | 5/2011 |
| WO | 2016/104598 A1 | 6/2016 |

* cited by examiner

MULTIPLEXER

CROSS REFERENCE TO RELATED APPLICATIONS

This application claims the benefit of priority to Japanese Patent Application No. 2016-216201 filed on Nov. 4, 2016. The entire contents of this application are hereby incorporated herein by reference.

BACKGROUND OF THE INVENTION

1. Field of the Invention

The present invention relates to a multiplexer including a filter circuit.

2. Description of the Related Art

Cellular phones in recent years are requested to individually operate with a plurality of frequency bands and with a plurality of wireless systems, that is, multi-bands and multi-modes. To cope with this, a multiplexer that divides a radio-frequency (RF) signal with a plurality of wireless carrier frequencies is disposed immediately below one antenna.

FIG. 8 is a circuit diagram of a duplexer described in Japanese Unexamined Patent Application Publication No. 2013-118611. A duplexer 600 illustrated in FIG. 8 includes a demultiplexer and a cancellation circuit 640. The demultiplexer includes a transmission-side filter circuit and a reception-side filter circuit. The cancellation circuit 640 includes a longitudinally-coupled elastic wave resonator 646, and capacitances 642 and 644. The cancellation circuit 640 generates an offset component that is in the opposite phase and has the same amplitude as a component in a certain frequency band flowing through the transmission-side filter circuit. With the above-described configuration, the isolation characteristics of the demultiplexer or the filter attenuation characteristics are improved without increasing the insertion loss.

However, because the duplexer 600 described in Japanese Unexamined Patent Application Publication No. 2013-118611 has the capacitances 642 and 644, which are arranged on both of an antenna terminal side and a transmission terminal side of the longitudinally-coupled elastic wave resonator 646, the size of the duplexer 600 including the cancellation circuit 640 is increased. Furthermore, when a capacitance necessary for the cancellation circuit 640 is secured while distributively arranging in series capacitive elements of the cancellation circuit 640 on both sides of the longitudinally-coupled elastic wave resonator 646, the capacitance per capacitive element increases, thereby lowering the impedance. Therefore, if the passband of the reception-side filter overlaps with the resonance response band of the longitudinally-coupled elastic wave resonator 646, ripples occur within the passband of the reception-side filter, thereby decreasing the bandwidth.

SUMMARY OF THE INVENTION

Preferred embodiments of the present invention provide multiplexers that improve attenuation characteristics of a first filter circuit to which a cancellation circuit is connected in parallel, and improve the bandpass characteristics of a second filter circuit connected to the first filter circuit with a common terminal interposed therebetween.

According to a preferred embodiment of the present invention, a multiplexer includes a common terminal, a first terminal, and a second terminal from and/or to which a radio-frequency (RF) signal is output and/or input; a first filter circuit that has a first frequency band as a passband and that is connected to the common terminal and the first terminal; a second filter circuit that has a second frequency band different from the first frequency band as a passband and that is connected to the common terminal and the second terminal; and a cancellation circuit that is connected to a first node and a second node that are on a path connecting the common terminal and the first terminal, the first node positioned closer to the common terminal, the second node positioned closer to the first terminal, and that offsets a component in a certain frequency band flowing through the path. The cancellation circuit includes a capacitive element including a first end connected to the first node; and a longitudinally-coupled resonator including a first end connected to a second end of the capacitive element, and a second end connected to the second node without including a capacitive element interposed therebetween. An impedance in the second frequency band when viewing the cancellation circuit from the first node side is higher than an impedance in the second frequency band when viewing the cancellation circuit from the second node side.

To improve the attenuation characteristics in a certain frequency band of the first filter circuit, a cancellation circuit that generates an offset component that offsets a component in the certain frequency band flowing through the above-mentioned path is connected in parallel with the first filter circuit. As the cancellation circuit, a longitudinally-coupled resonator is used, which is advantageous in that is has low loss only in the above-mentioned certain frequency band. Here, to adjust the offset component to be of the same or substantially the same amplitude and in the opposite phase from the above-mentioned component on the path, a capacitive element for amplitude and phase adjustment is connected in series with the cancellation circuit. As the capacitive element connected in series with the cancellation circuit, a distributive arrangement at two ends of the longitudinally-coupled resonator is considered, which takes into consideration the impedance matching between the first filter circuit and the cancellation circuit.

In contrast, according to a preferred embodiment of the present invention, the capacitive element of the cancellation circuit is not arranged on the second node side of the longitudinally-coupled resonator, but is arranged only on the first node side. Accordingly, to provide the same or substantially the same capacitance as that in the case where capacitive elements are arranged at two ends of the longitudinally-coupled resonator (two capacitive elements are arranged in series), it is only necessary that a capacitive element that has a smaller capacitance than one of the two series-arranged capacitive elements be arranged only on the common terminal side of the longitudinally-coupled resonator. In doing so, the cancellation circuit is able to be made smaller than a cancellation circuit in which two capacitive elements are arranged.

In a cancellation circuit in which a certain capacitance is necessary, arranging the capacitive element only on the first node side of the common terminal side of the longitudinally-coupled resonator provides an impedance when viewing the cancellation circuit from the first node side that is greater than an impedance when viewing the cancellation circuit from the second node side. Here, the above-described impedance of the cancellation circuit functions as the impedance in the passband (second frequency band) of the second filter circuit. Therefore, a signal in the second frequency band, input from the common terminal, is prevented from leaking towards the first filter side.

Accordingly, the multiplexer circuit is able to be made smaller, the attenuation characteristics of the first filter circuit are able to be improved, and the bandpass characteristics of the second filter circuit are able to be improved.

The first node may be the common terminal.

Accordingly, in a cancellation circuit in which a certain capacitance is necessary, arranging the capacitive element only on the common terminal side of the longitudinally-coupled resonator provides an impedance when viewing the cancellation circuit from the common terminal side greater than an impedance when viewing the cancellation circuit from the second node side. Therefore, a signal in the second frequency band, input from the common terminal, is effectively prevented from leaking towards the first filter side.

The first frequency band may be positioned lower than the second frequency band, the certain frequency band may be included in the second frequency band, and a frequency at which the insertion loss of the longitudinally-coupled resonator is at a minimum may be positioned close to the second frequency band.

When the certain frequency band including a frequency at which the insertion loss of the longitudinally-coupled resonator is minimum is set in the second frequency band in order to improve the attenuation characteristics higher than the passband (first frequency band) of the first filter circuit, it is feared that the bandpass characteristics of the second filter circuit will deteriorate. In contrast, because an impedance in the second frequency band when viewing the cancellation circuit from the common terminal side (first node) is higher than an impedance in the second frequency band when viewing the cancellation circuit from the second node side, the bandpass characteristics of the second filter circuit are able to be improved. Furthermore, because the attenuation characteristics in the second frequency band of the first filter circuit are improved, the isolation characteristics between the first filter circuit and the second filter circuit are improved. Additionally, since the certain frequency band is not set in the first frequency band, the bandpass characteristics of the first filter circuit are prevented from deteriorating.

The first filter circuit may be a ladder elastic wave filter circuit including a plurality of elastic wave resonators.

When the first filter circuit is a ladder elastic wave filter circuit, there is no complex phase change in the attenuation band of the first filter circuit, and accordingly, the longitudinally-coupled resonator easily defines a component in the opposite phase from a component flowing through the path of the first filter circuit. Therefore, more powerful effects to improve the attenuation characteristics of the first filter circuit and the isolation characteristics between the first filter circuit and the second filter circuit are produced.

The first filter circuit may be a transmission-side filter that propagates an RF signal from the first terminal to the common terminal, the second filter circuit may be a reception-side filter that propagates an RF signal from the common terminal to the second terminal, and a series arm resonator may be connected on the path between the first terminal and the second node.

With this configuration, a duplexer in which a transmission-side filter and a reception-side filter are connected by a common terminal is provided. Here, electric power and surges applied from the transmission-side terminal (first terminal) first pass the series arm resonator, which results in the intensity of a signal applied to the longitudinally-coupled resonator of the cancellation circuit becoming smaller. That is, the electric power handling capability and the surge handling capability of the duplexer is improved.

The first filter circuit may be a surface acoustic wave (SAW) filter including a plurality of first interdigital transducer (IDT) electrodes provided on a piezoelectric substrate, and the longitudinally-coupled resonator may be a SAW resonator including a plurality of second IDT electrodes provided on the substrate.

With this configuration, because the first filter circuit and the longitudinally-coupled resonator include SAW resonators provided on the same piezoelectric substrate, the multiplexer is able to be made smaller.

The capacitive element may include a comb-shaped electrode provided on the substrate.

With this configuration, because the first filter circuit and the cancellation circuit are provided on the same piezoelectric substrate, the multiplexer is able to be made smaller.

The plurality of first IDT electrodes may include a first electrode film, first wiring connecting the plurality of first IDT electrodes may be defined by a multilayer body including the first electrode film and a second electrode film, and second wiring connecting the first node, the capacitive element, the plurality of second IDT electrodes, and the second node may have a same film thickness as the first electrode film.

The first wiring connecting the first IDT electrodes is defined by a two-layer wiring in order to provide low loss in the passband of the first filter circuit. In contrast, the second wiring of the cancellation circuit may be defined by a single-layer wiring since no big problem is caused even when a resistance component increases, because the offset component flowing through the cancellation circuit has a small amplitude. Thus, the second wiring is able to be made thinner, thus making it possible to reduce the chip size.

The first filter circuit may be a ladder SAW filter including a series arm resonator and a parallel arm resonator, and when viewed in a plan view of the substrate, an area that is an extension of a SAW propagation path of the longitudinally-coupled resonator in a propagating direction need not overlap with a SAW propagation path of the parallel arm resonator or a SAW propagation path of the series arm resonator.

Because an offset component generated by the cancellation circuit has a small amplitude, if transmission paths of the longitudinally-coupled resonator and the series arm resonator and the parallel arm resonator of the first filter circuit are arranged side by side, the offset component is interfered with by surface acoustic waves of the series arm resonator and the parallel arm resonator, and the phase characteristics of the offset component are influenced to deteriorate the attenuation characteristics of the first filter circuit. In contrast, according to the above-described configuration, the attenuation characteristics of the first filter circuit are able to be improved.

The second filter circuit may be a SAW filter including a plurality of third IDT electrodes provided on the substrate; and ground wiring connected to the longitudinally-coupled resonator may be connected to a ground electrode connected to the first filter circuit on the substrate, and may not be connected to a ground electrode connected to the second filter circuit on the substrate.

Accordingly, because the ground wiring connected to the longitudinally-coupled resonator is connected to the ground electrode connected to the first filter circuit, a ground electrode is shared between the longitudinally-coupled resonator and the first filter circuit on the piezoelectric substrate, thus making it possible to further reduce the chip size. In contrast, because the ground wiring connected to the longitudinally-coupled resonator is not connected to a ground electrode connected to the second filter circuit, the response of the longitudinally-coupled resonator is prevented from going around and cutting into the second filter via the ground electrode. Accordingly, the bandpass characteristics of the second filter circuit are prevented from deteriorating.

According to various preferred embodiments of the present invention, multiplexers improve the attenuation characteristics of a first filter circuit to which a cancellation circuit is connected in parallel, and improve the bandpass characteristics of a second filter circuit connected to the first filter circuit by a common terminal.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
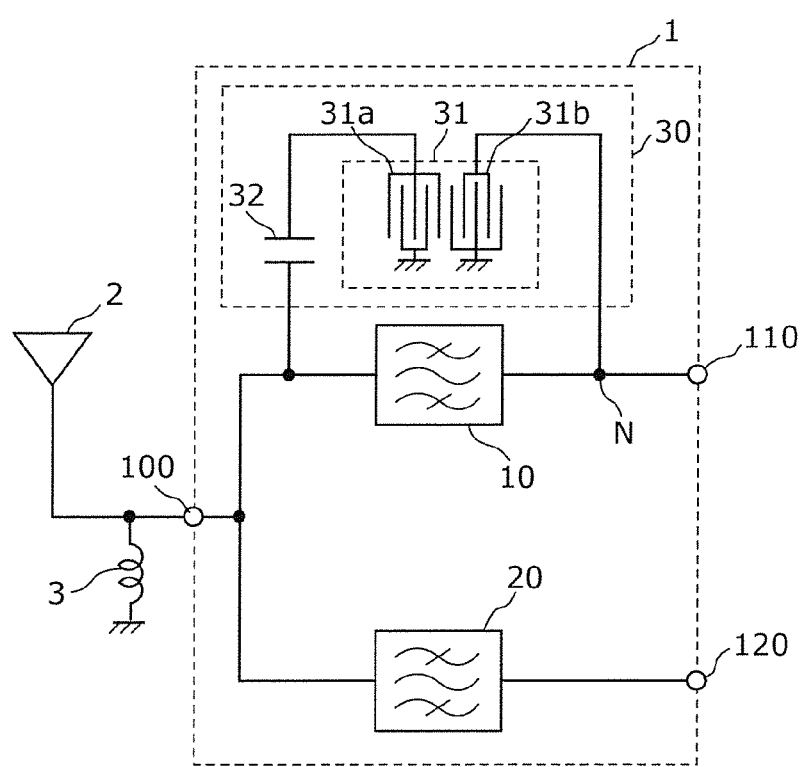
FIG. 1 is a circuit diagram of a multiplexer according to a preferred embodiment of the present invention and its surrounding circuit.

Hereinafter, preferred embodiments of the present invention will be described in detail using examples and referring to the drawings. The examples described below all illustrate comprehensive or specific examples. The numerals, shapes, materials, elements, and the arrangement and connections of the elements discussed in the following examples are only exemplary and are not construed to limit the present invention. Among the elements in the following examples, elements not described in an independent claim will be described as arbitrary elements. The sizes or size ratios of elements illustrated in the drawings are not necessarily exact or to scale.

FIG. 1 is a circuit diagram of a multiplexer 1 according to a preferred embodiment of the present invention and its surrounding circuit. FIG. 1 illustrates the multiplexer 1 according to the present preferred embodiment, an antenna device 2, and a matching inductor 3.

The multiplexer 1 includes a transmission-side filter 10, a reception-side filter 20, a cancellation circuit 30, a common terminal 100, a transmission-side terminal (first terminal) 110, and a reception-side terminal (second terminal) 120. The transmission-side filter 10 and the reception-side filter 20 are commonly connected by the common terminal 100. With this configuration, the multiplexer 1 defines and functions as a duplexer that outputs an RF signal received at the antenna device 2 from the reception-side terminal 120 via the common terminal 100 and the reception-side filter 20, and outputs an RF signal input from the transmission-side terminal 110 to the antenna device 2 via the transmission-side filter 10 and the common terminal 100.

An amplifier circuit that amplifies an RF signal or an RF signal processing circuit (RF integrated circuit (RFIC)), for example, is connected to the transmission-side terminal 110 and the reception-side terminal 120. The common terminal 100 need not be connected to the antenna device 2, and the common terminal 100 may preferably be connected to the antenna device 2 with a switch circuit interposed therebetween, for example. An inductor or a capacitor for impedance matching may preferably be provided between the common terminal 100 and the transmission-side filter 10 and reception-reception side filter 20, for example.

The transmission-side filter 10 is a first filter circuit that has a first frequency band as a passband and that is connected to the common terminal 100 and the transmission-side terminal 110.

The reception-side filter 20 is a second filter circuit that has a second frequency band different from the first frequency band as a passband and that is connected to the common terminal 100 and the reception-side terminal 120.

Although either of the first frequency band and the second frequency band may be higher than the other, the present preferred embodiment will discuss an exemplary circuit configuration in which the second frequency band is higher than the first frequency band, that is, the passband of the reception-side filter 20 is higher than the passband of the transmission-side filter 10.

The cancellation circuit 30 is connected to the common terminal 100 (first node) and a node N (second node) that is on a path connecting the common terminal 100 and the transmission-side terminal 110. The cancellation circuit 30 is a circuit that offsets a component in a certain frequency band flowing through the path.

More specifically, the cancellation circuit 30 includes a longitudinally-coupled resonator 31 and a capacitive element 32. The longitudinally-coupled resonator 31 includes elastic wave resonators 31a and 31b. A first end of the longitudinally-coupled resonator 31 (elastic wave resonator 31a) is connected to a second end of the capacitive element 32, and a second end of the longitudinally-coupled resonator 31 (elastic wave resonator 31b) is connected to the node N with no capacitive element interposed therebetween. A first end of the capacitive element 32 is connected to the common terminal 100.

Here, an impedance in the second frequency band when viewing the cancellation circuit 30 from the common terminal 100 side is higher than an impedance in the second frequency band when viewing the cancellation circuit 30 from the node N side.

According to the above-described configuration, to improve the attenuation characteristics in a certain frequency band that is higher than the first frequency band of the transmission-side filter 10, the cancellation circuit 30, which generates an offset component that offsets a component in the certain frequency band flowing through the above-described path, is connected in parallel with the transmission-side filter 10. As the cancellation circuit 30, the longitudinally-coupled resonator 31 is preferably used, which is advantageous in that it has low loss only in the certain frequency band, compared to other frequency bands over a wide band. Here, to adjust the offset component to be of the same or substantially the same amplitude and in the opposite phase from the certain frequency band component flowing through the path, the capacitive element 32 for amplitude and phase adjustment is connected in series with the cancellation circuit 30.

In general, as a capacitive element connected in series with a cancellation circuit, a distributive arrangement at two ends of a longitudinally-coupled resonator is considered, which takes into consideration the impedance matching between a filter circuit to which the cancellation circuit is connected in parallel and the cancellation circuit.

In contrast, according to the configuration of the multiplexer 1 according to the present preferred embodiment, the capacitive element of the cancellation circuit 30 is not arranged on the node N side of the longitudinally-coupled resonator 31, but is arranged only on the common terminal 100 side. Accordingly, to provide the same or substantially the same capacitance as that of a configuration of the related art where capacitive elements are distributively arranged at two ends of a longitudinally-coupled resonator (two capacitive elements are arranged in series), it is only necessary that the capacitive element 32, which has a smaller capacitance than one of the two series-arranged capacitive elements, be arranged only on the common terminal 100 side of the longitudinally-coupled resonator 31. As such, the cancellation circuit 30 is able to be made smaller than a cancellation circuit of the related art where two capacitive elements are arranged.

In a cancellation circuit where a certain capacitance is necessary, arranging the capacitive element 32 only on the common terminal 100 side of the longitudinally-coupled resonator 31 provides an impedance when viewing the cancellation circuit 30 from the common terminal 100 side greater than an impedance when viewing the cancellation circuit 30 from the node N side. Here, in the multiplexer 1 according to the present preferred embodiment, the impedance of the cancellation circuit 30 defines and functions as the impedance in the passband (second frequency band) of the reception-side filter 20. As such, an impedance in the second frequency band when viewing the cancellation circuit 30 from the common terminal 100 side is greater than an impedance in the second frequency band when viewing the cancellation circuit 30 from the node N side. Therefore, a signal in the second frequency band, input from the common terminal 100, is prevented from leaking toward the transmission-side filter 10.

Accordingly, the multiplexer 1 is able to be made smaller, the attenuation characteristics in the certain frequency band of the transmission-side filter 10 are able to be improved, and the bandpass characteristics of the reception-side filter 20 are able to be improved.

Although the configuration in the present preferred embodiment is such that the cancellation circuit 30 is connected to the common terminal 100 and the node N, a cancellation circuit according to preferred embodiments of the present invention may not be directly connected to the common terminal 100, but may preferably be connected to a node (first node) on each of series arms connecting series arm resonators 12s1 to 14s2 included in the transmission-side filter 10, and to the node N (second node). That is, it is only necessary for the cancellation circuit to be connected to a first node that is on a path connecting the common terminal 100 and the transmission-side terminal 110 and that is closer to the common terminal 100, and to a second node that is on the path connecting the common terminal 100 and the transmission-side terminal 110 and that is closer to the transmission-side terminal 110. Even with this configuration, the same or similar advantageous effects as those of the cancellation circuit 30 and the multiplexer 1 according to the present preferred embodiment are able to be achieved, the attenuation characteristics in the certain frequency band of the transmission-side filter 10 are able to be improved, and the bandpass characteristics of the reception-side filter 20 are able to be improved.

Hereinafter, an exemplary specific circuit configuration of the multiplexer 1 according to a preferred embodiment of the present invention will be discussed, and the multiplexer 1 will be described in detail.

Figure 2:
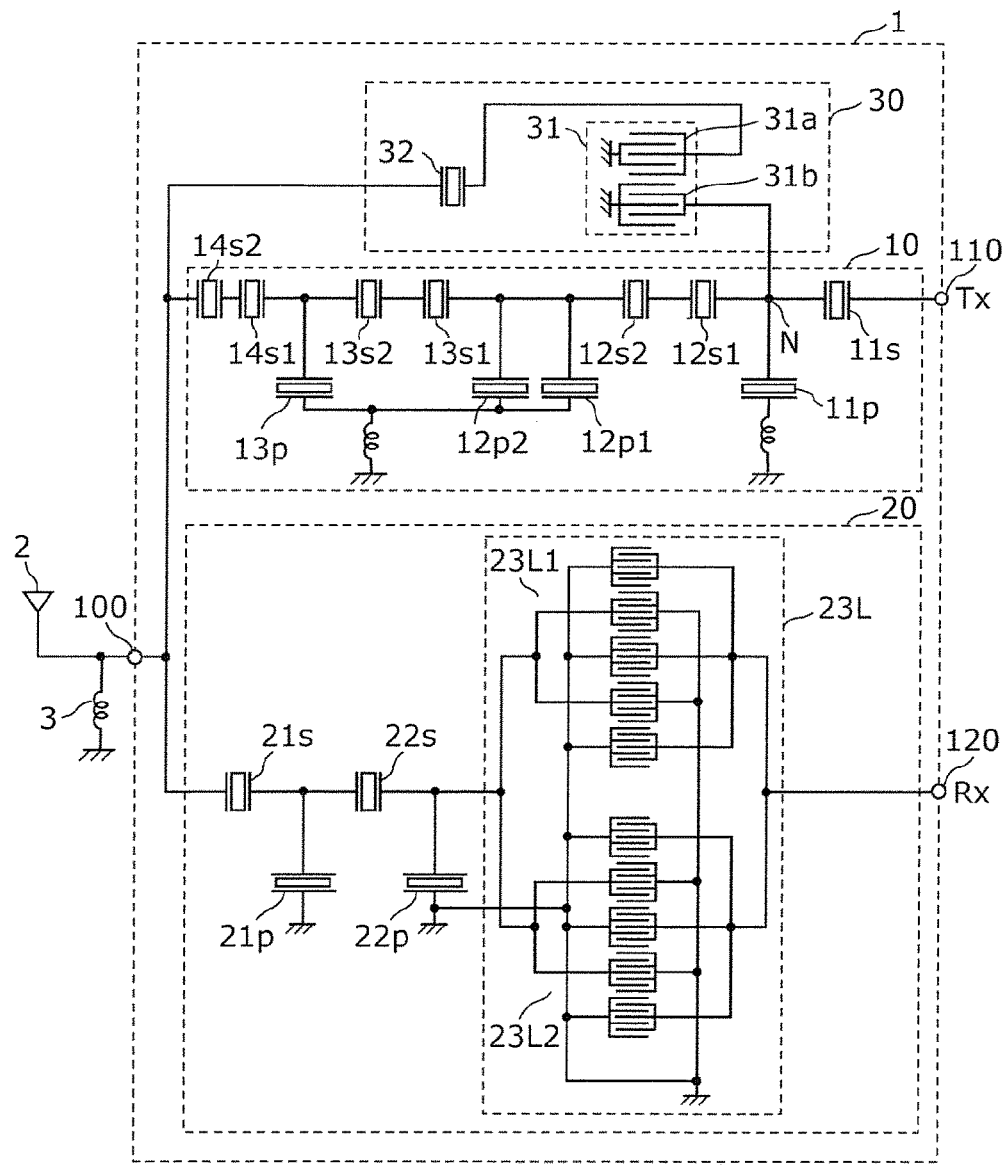
FIG. 2 is a specific circuit diagram of a multiplexer according to an example of a preferred embodiment of the present invention.

FIG. 2 is a diagram illustrating an exemplary specific configuration of the multiplexer 1 according to an example of a preferred embodiment of the present invention. The multiplexer 1 illustrated in FIG. 2 includes the transmission-side filter 10, the reception-side filter 20, the cancellation circuit 30, the common terminal 100, the transmission-side terminal 110, and the reception-side terminal 120, like FIG. 1.

The transmission-side filter 10 is a ladder elastic wave filter circuit including a plurality of elastic wave resonators, and includes series arm resonators 11s, 12s1, 12s2, 13s1, 13s2, 14s1, and 14s2, and parallel arm resonators 11p, 12p1, 12p2, and 13p. According to this configuration, the transmission-side filter 10 is preferably applied to, for example, the Long Term Evolution (LTE) Band 8 transmission filter (transmission (first frequency) band: about 880 MHz to about 915 MHz).

Because the transmission-side filter 10 is a ladder elastic wave filter circuit, there is no complex phase change in the attenuation band of the transmission-side filter 10, and accordingly, the longitudinally-coupled resonator 31 is able to easily provide a component in the opposite phase from a component flowing through the path of the transmission-side filter 10. Therefore, more powerful effects to improve the attenuation characteristics of the transmission-side filter 10 and the isolation characteristics between the transmission-side filter 10 and the reception-side filter 20 are produced.

Furthermore, each of the series arm resonators 11s to 14s2 and the parallel arm resonators 11p to 13p includes interdigital transducer (IDT) electrodes provided on a piezoelectric substrate. As such, the transmission-side filter 10 is a surface acoustic wave (SAW) filter including a plurality of first IDT electrodes provided on the piezoelectric substrate.

The reception-side filter 20 is an elastic wave filter circuit including a plurality of elastic wave resonators, and includes series arm resonators 21s and 22s, parallel-arm resonators 21p and 22p, and a longitudinally-coupled resonator 23L. The longitudinally-coupled resonator 23L includes parallel-connected longitudinally-coupled resonators 23L1 and 23L2, and each of the longitudinally-coupled resonators 23L1 and 23L2 includes five elastic wave resonators arranged along an elastic wave propagating direction. According to this configuration, the reception-side filter 20 is preferably applied to, for example, the LTE Band 8 reception filter (reception (second frequency) band: about 925 MHz to about 960 MHz). Note that each of the series arm resonators 21s and 22s, the parallel arm resonators 21p and 22p, and the elastic wave resonators included in the longitudinally-coupled resonator 23L includes IDT electrodes provided on a piezoelectric substrate. As such, the reception-side filter 20 is a SAW filter including a plurality of IDT electrodes provided on the piezoelectric substrate.

The cancellation circuit 30 includes the longitudinally-coupled resonator 31 and the capacitive element 32. Although the capacitive element 32 is represented by an elastic wave resonator in FIG. 2, this means that the capacitive element 32 may be provided by an elastic wave resonator that is capacitive, such as a SAW resonator (e.g., a one-port resonator), for example.

The longitudinally-coupled resonator 31 includes two elastic wave resonators 31a and 31b, which are arranged along the elastic wave propagating direction. A first end of the longitudinally-coupled resonator 31 (elastic wave resonator 31a) is connected to a second end of the capacitive element 32, and a second end of the longitudinally-coupled resonator 31 (elastic wave resonator 31b) is connected to the node N with no capacitive element interposed therebetween. Furthermore, each of the elastic wave resonators 31a and 31b preferably includes IDT electrodes located on a piezoelectric substrate on which the transmission-side filter 10 is provided. As such, the cancellation circuit 30 is a SAW resonator including a plurality of second IDT electrodes located on the piezoelectric substrate. IDT electrodes included in the elastic wave resonator 31a include two comb-shaped electrodes facing each other. One of the comb-shaped electrodes is connected to the second end of the capacitive element 32, and the other one of the comb-shaped electrodes is connected to a ground electrode. IDT electrodes included in the elastic wave resonator 31b include two comb-shaped electrodes facing each other. One of the comb-shaped electrodes is connected to the node N, and the other one of the comb-shaped electrodes is connected to the ground electrode.

Because the transmission-side filter 10 and the longitudinally-coupled resonator 31 are provided on the same piezoelectric substrate, the multiplexer 1 is able to be made smaller.

In the present example, the series arm resonator 11s included in the transmission-side filter 10 is preferably arranged between the node N and the transmission-side terminal 110. As such, electric power and surges applied from the transmission-side terminal 110 first pass the series arm resonator 11s, which means that the intensity of a signal applied to the longitudinally-coupled resonator 31 of the cancellation circuit 30 becomes smaller. As such, the electric power handling capability and the surge handling capability of the multiplexer 1 are improved.

Note that the number of elastic wave resonators (IDT electrodes) included in the longitudinally-coupled resonator 31 is not limited to two, and the number may be appropriately determined in accordance with bandpass characteristics necessary for the cancellation circuit 30.

A first end of the capacitive element 32 is connected to the common terminal 100, and a second end of the capacitive element 32 is connected to the first end (elastic wave resonator 31a) of the longitudinally-coupled resonator 31.

Note that the capacitive element 32 preferably includes a comb-shaped electrode provided on a piezoelectric substrate on which the transmission-side filter 10 and the longitudinally-coupled resonator 31 are provided.

Because the transmission-side filter 10, the longitudinally-coupled resonator 31, and the capacitive element 32 are provided on the same piezoelectric substrate, the multiplexer 1 is able to be made smaller.

Figure 3:
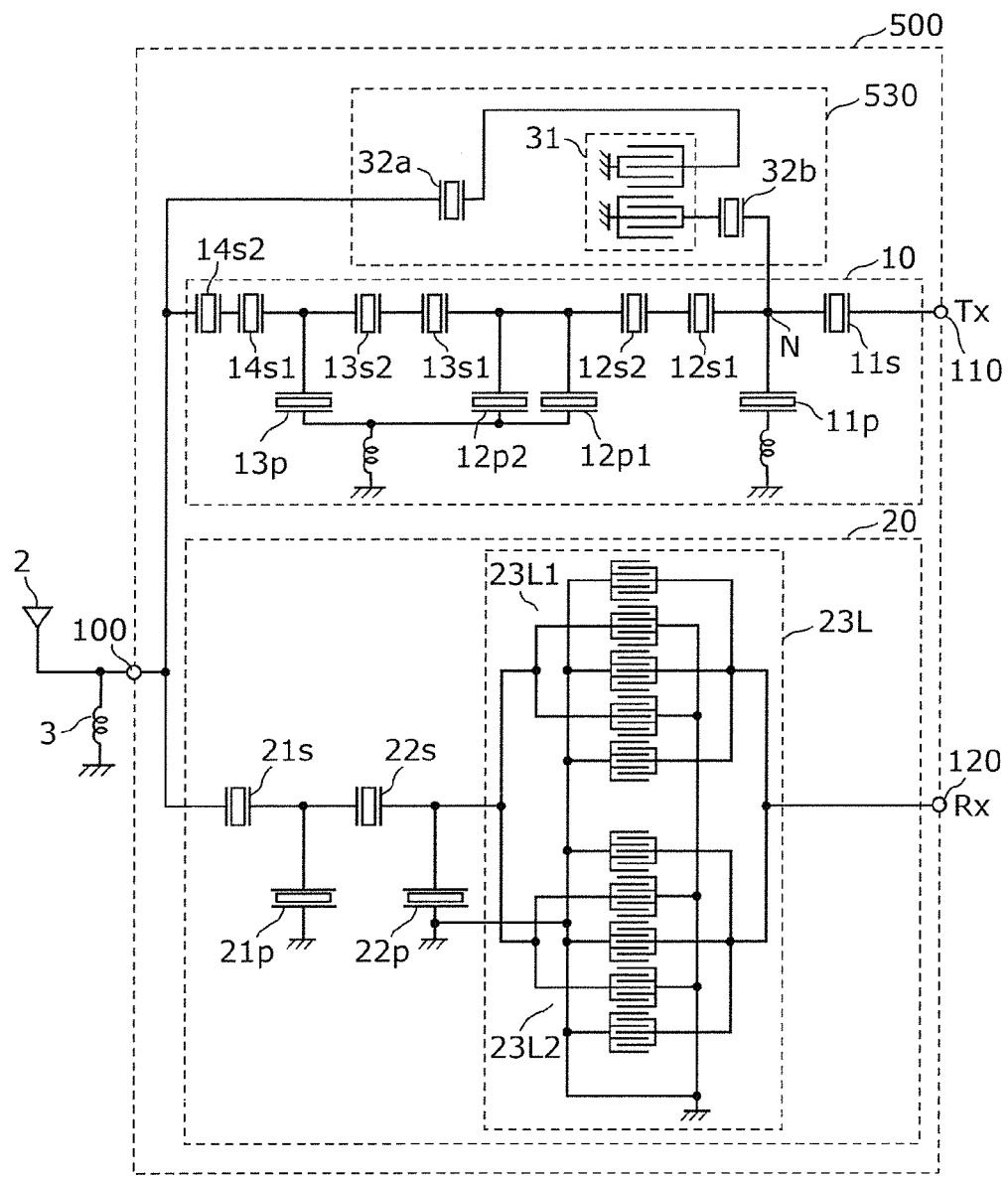
FIG. 3 is a specific circuit diagram of a multiplexer according to a comparative example.

FIG. 3 is a specific circuit diagram of a multiplexer 500 according to a comparative example. The multiplexer 500 illustrated in FIG. 3 includes the transmission-side filter 10, the reception-side filter 20, a cancellation circuit 530, the common terminal 100, the transmission-side terminal 110, and the reception-side terminal 120. The multiplexer 500 illustrated in FIG. 3 is different from the multiplexer 1 according to the example of a preferred embodiment described above only in the configuration of the cancellation circuit. Hereinafter, the multiplexer 500 according to the comparative example will be described by primarily discussing different points while omitting the same and similar points as the multiplexer 1 according to the example of a preferred embodiment described above.

The cancellation circuit 530 includes the longitudinally-coupled resonator 31 and capacitive elements 32a and 32b.

The longitudinally-coupled resonator 31 of the cancellation circuit 530 includes the two elastic wave resonators 31a and 31b, which are arranged along the elastic wave propagating direction. A first end of the longitudinally-coupled resonator 31 (elastic wave resonator 31a) is connected to a second end of the capacitive element 32a, and a second end of the longitudinally-coupled resonator 31 (elastic wave resonator 31b) is connected to a second end of the capacitive element 32b. Furthermore, each of the elastic wave resonators 31a and 31b includes IDT electrodes provided on a piezoelectric substrate on which the transmission-side filter 10 is provided. IDT electrodes included in the elastic wave resonator 31a include two comb-shaped electrodes facing each other. One of the comb-shaped electrodes is connected to the second end of the capacitive element 32a, and the other one of the comb-shaped electrodes is connected to a ground electrode. IDT electrodes included in the elastic wave resonator 31b include two comb-shaped electrodes facing each other. One of the comb-shaped electrodes is connected to the second end of the capacitive element 32b, and the other one of the comb-shaped electrodes is connected to the ground electrode.

A first end of the capacitive element 32a is connected to the common terminal 100, and the second end of the capacitive element 32a is connected to the first end (elastic wave resonator 31a) of the longitudinally-coupled resonator 31. A first end of the capacitive element 32b is connected to the node N, and the second end of the capacitive element 32b is connected to the second end (elastic wave resonator 31b) of the longitudinally-coupled resonator 31.

In general, with the configuration of the multiplexer 500 according to the comparative example illustrated in FIG. 3, the capacitive elements 32a and 32b are distributively arranged at two ends of the longitudinally-coupled resonator 31, which takes into consideration the impedance matching between the transmission-side filter 10 to which the cancellation circuit 530 is connected in parallel and the cancellation circuit 530.

In contrast, with the configuration of the multiplexer 1 according to the example of a preferred embodiment described above, to improve the attenuation characteristics in a certain frequency band that is higher than the first frequency band of the transmission-side filter 10, the cancellation circuit 30, which generates an offset component to offset a component in the certain frequency band flowing through the above-mentioned path, is connected in parallel with the transmission-side filter 10. Here, to adjust the offset component to be of the same or substantially the same amplitude and in the opposite phase from the above-described component in the second frequency band flowing through the path, the capacitive element 32 for amplitude and phase adjustment is connected in series with the cancellation circuit 30.

According to the configuration of the multiplexer 1 according to the example of a preferred embodiment described above, the capacitive element 32 of the cancellation circuit 30 is not arranged on the node N side of the longitudinally-coupled resonator 31, but is arranged only on the common terminal 100 side. Accordingly, to provide the same or substantially the same capacitance as that of the comparative example in which the capacitive elements 32a and 32b are arranged distributively at (in series with) two ends of the longitudinally-coupled resonator 31, it is only necessary that the capacitive element 32, which has a smaller capacitance than one of the two series-arranged capacitive elements 32a and 32b, be arranged only on the common terminal 100 side of the longitudinally-coupled resonator 31.

As such, the cancellation circuit 30 is able to be made smaller than the cancellation circuit 530 of the related art where the two capacitive elements 32a and 32b are arranged distributively at (in series with) two ends of the longitudinally-coupled resonator 31.

In a cancellation circuit in which a certain capacitance is necessary, arranging the capacitive element 32 only on the common terminal 100 side of the longitudinally-coupled resonator 31 makes an impedance when viewing the cancellation circuit 30 from the common terminal 100 side greater than an impedance when viewing the cancellation circuit 30 from the node N side. Here, in the multiplexer 1 according to the example of a preferred embodiment described above, the impedance of the cancellation circuit 30 defines and functions as the impedance in the passband (second frequency band) of the reception-side filter 20. As such, an impedance in the second frequency band when viewing the cancellation circuit 30 from the common terminal 100 side is greater than an impedance in the second frequency band when viewing the cancellation circuit 30 from the node N side. Therefore, a signal in the second frequency band, input from the common terminal 100, is prevented from leaking towards the transmission-side filter 10.

Figure 4A:
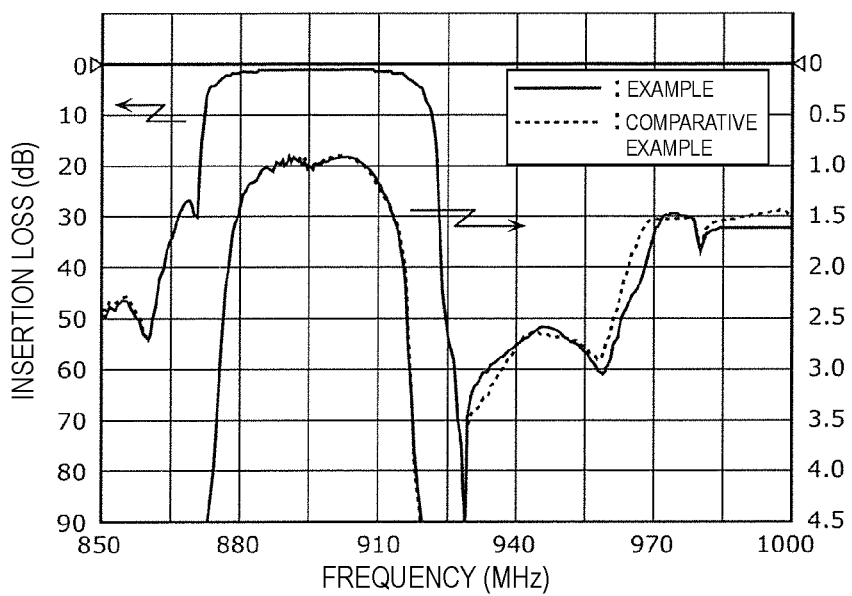
FIG. 4A is a graph comparing the bandpass characteristics of a transmission-side filter according to an example of a preferred embodiment of the present invention and the comparative example.
Figure 4B:
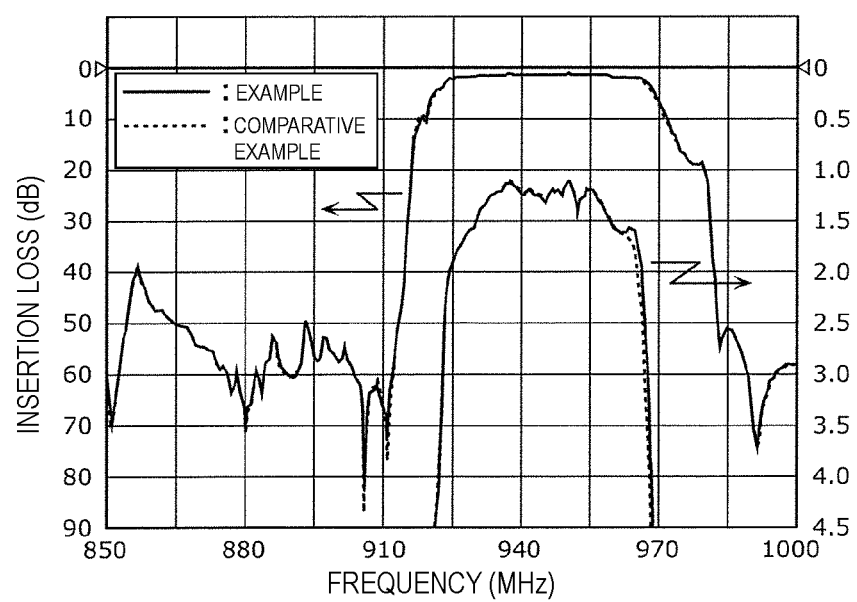
FIG. 4B is a graph comparing the bandpass characteristics of a reception-side filter according to an example of a preferred embodiment of the present invention and the comparative example.
Figure 4C:
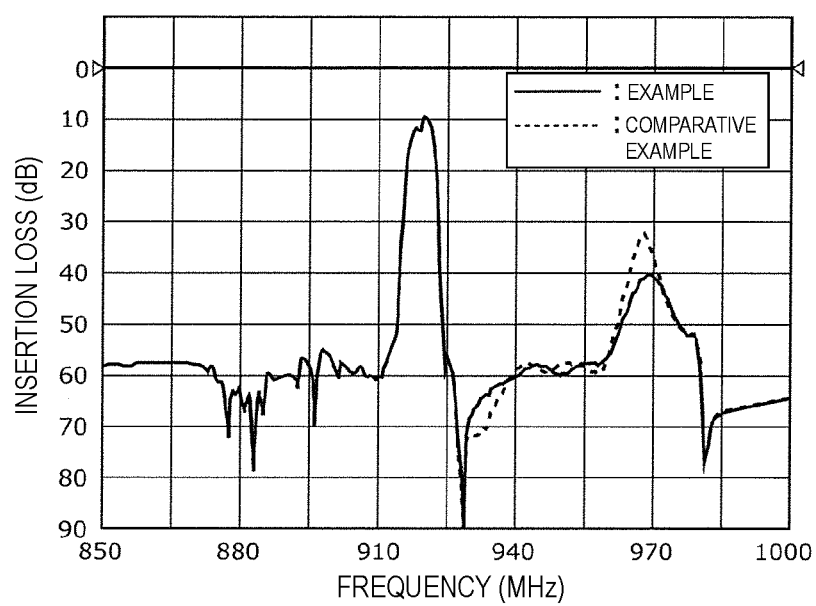
FIG. 4C is a graph comparing the isolation characteristics of the multiplexer according to an example of a preferred embodiment of the present invention and the comparative example.
Figure 5:
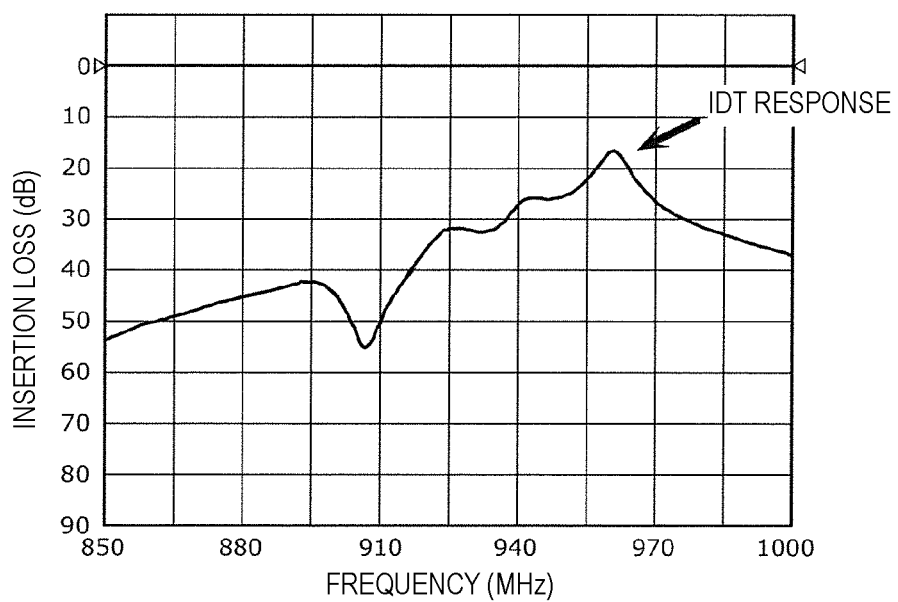
FIG. 5 is a graph representing the bandpass characteristics of a cancellation circuit according to an example of a preferred embodiment of the present invention.

FIG. 4A is a graph comparing the bandpass characteristics of the transmission-side filter 10 according to the example of a preferred embodiment described above and the comparative example. FIG. 4B is a graph comparing the bandpass characteristics of the reception-side filter 20 according to the example of a preferred embodiment described above and the comparative example. FIG. 4C is a graph comparing the isolation characteristics of the multiplexer according to the example of a preferred embodiment described above and the comparative example. FIG. 5 is a graph representing the bandpass characteristics of the cancellation circuit 30 according to the example. Table 1 represents the electrode parameters of the cancellation circuit according to the example of a preferred embodiment described above and the comparative example.

TABLE 1

|  |  | Example | Comparative Example |
|---|---|---|---|
| Capacitive element (32 or 32a) (common terminal 100 side) | Cross width (μm) | 12 | 30 |
|  | Number of pairs (pairs) | 15 | 15 |
| Capacitive element (32b) (Node N side) | Cross width (μm) |  | 19 |
|  | Number of pairs (pairs) |  | 13 |
| Elastic wave resonator 31a (common terminal 100 side) | Cross width (μm) | 47 | 47 |
|  | Number of pairs (pairs) | 5 | 5 |
| Elastic wave resonator 31b (Node N side) | Cross width (μm) | 47 | 47 |
|  | Number of pairs (pairs) | 7 | 7 |

Here, in the example of a preferred embodiment described above, the passband (first frequency band) of the transmission-side filter 10 is positioned lower than the passband (second frequency band) of the reception-side filter 20, and a resonance response frequency that has the minimum point of insertion loss of the cancellation circuit 30 is positioned at the higher frequency end of the second frequency band.

As illustrated in FIG. 4A, the bandpass characteristics of the transmission-side terminal 110-common terminal 100 of the transmission-side filter 10 according to the example of a preferred embodiment described above and the comparative example are good in the transmission band (about 880 MHz to about 915 MHz). Additionally, good attenuation characteristics are provided in the example of a preferred embodiment described above and the comparative example in the reception band (about 925 MHz to about 960 MHz). As illustrated in FIG. 4C, the isolation characteristics between the transmission and reception filters according to the example of a preferred embodiment described above and the comparative example are good in the transmission band (about 880 MHz to about 915 MHz) and in the reception band (about 925 MHz to about 960 MHz). Therefore, the cancellation circuit according to the example of a preferred embodiment described above and the comparative example (1) has a resonance response that has the minimum point of insertion loss near about 960 MHz; and (2) the capacitive element(s) generate(s) an offset component that is of the same or substantially the same amplitude and in the opposite phase from a component near about 960 MHz passing the transmission-side filter 10. Accordingly, it has been determined that the improvement of the attenuation characteristics of the transmission-side filter 10 and the transmission/reception isolation characteristics is functioning effectively.

In contrast, as illustrated in FIG. 4B, a comparison of the bandpass characteristics of the reception-side terminal 120-common terminal 100 of the reception-side filter 20 according to the example of a preferred embodiment described above and the comparative example indicates that the reception-side filter 20 according to the comparative example has a narrower passband. Specifically, loss near the higher frequency channel side of the reception band is deteriorated in the comparative example. For example, the bandwidth is compared for an insertion loss of about 2.0 dB as follows: the bandwidth in the example of a preferred embodiment described above is about 41.8 MHz, whereas the bandwidth in the comparative example is about 40.9 MHz. Thus, the band is wider in the example of a preferred embodiment described above. In the case of a SAW filter in particular, because it is necessary to secure the bandwidth by taking into consideration characteristics changes caused by temperature changes, this bandwidth difference results in a great difference in filter characteristics.

The capacitance (cross width×number of pairs) of the capacitive element 32a according to the comparative example is greater than the capacitance (cross width×number of pairs) of the capacitive element 32 according to the example of a preferred embodiment described above, resulting in a lower impedance. Therefore, the reception-side filter 20 is more susceptible to the resonance response near the higher frequency channel side (near about 960 MHz), generated by the longitudinally-coupled resonator 31 of the cancellation circuit 530. Thus, the impedance viewed from the common terminal side of the cancellation circuit 530 is not set to be higher than the impedance viewed from the node N side of the cancellation circuit 530. Therefore, high frequency components near the higher frequency channel side leak to the cancellation circuit 530, thus increasing the propagation loss of the high frequency components to the reception-side filter 20. Accordingly, ripples are caused by the resonance response on the higher frequency side of the passband of the reception-side filter through the common terminal 100, which makes the bandwidth narrower.

In contrast, in the example of a preferred embodiment described above, there is no capacitive element on the node N side of the longitudinally-coupled resonator 31. Instead, the capacitive element 32, which has a smaller capacitance than the capacitive element 32a according to the comparative example, is provided on the common terminal 100 side of the longitudinally-coupled resonator 31. As such, the impedance viewed from the common terminal 100 side of the cancellation circuit 30 is set to be higher than the impedance viewed from the node N side of the cancellation circuit 30. Therefore, high frequency components near the higher frequency channel side do not leak to the cancellation circuit 30, thus reducing the propagation loss of the high frequency components to the reception-side filter 20. Accordingly, ripples caused by the resonance response on the higher frequency side of the passband of the reception-side filter 20 through the common terminal 100 are prevented from occurring, which makes it possible to provide a wide bandwidth.

Meanwhile, in an example of a preferred embodiment described above, no capacitive element is connected between the node N and the longitudinally-coupled resonator 31. As illustrated in FIG. 5, because the resonance response (near about 960 MHz) of the longitudinally-coupled resonator 31 is greatly spaced away, to the higher frequency side, from the transmission passband, the bandwidth of the transmission-side filter 10 is not deteriorated.

In an example of a preferred embodiment described above, only one capacitive element is provided in the cancellation circuit 30, and amplitude matching with the amplitude of a main signal of the transmission-side filter 10 is achieved only using the capacitive element 32. Therefore, the impedance of the capacitive element 32 is able to be made higher than that in the comparative example. Accordingly, in the multiplexer 1 according to the example of a preferred embodiment described above, with the configuration in which the capacitive element 32 is connected in series only between the common terminal 100 and the longitudinally-coupled resonator 31, the chip size is able to be made smaller without deteriorating the bandwidth of the reception-side filter 20.

Figure 6:
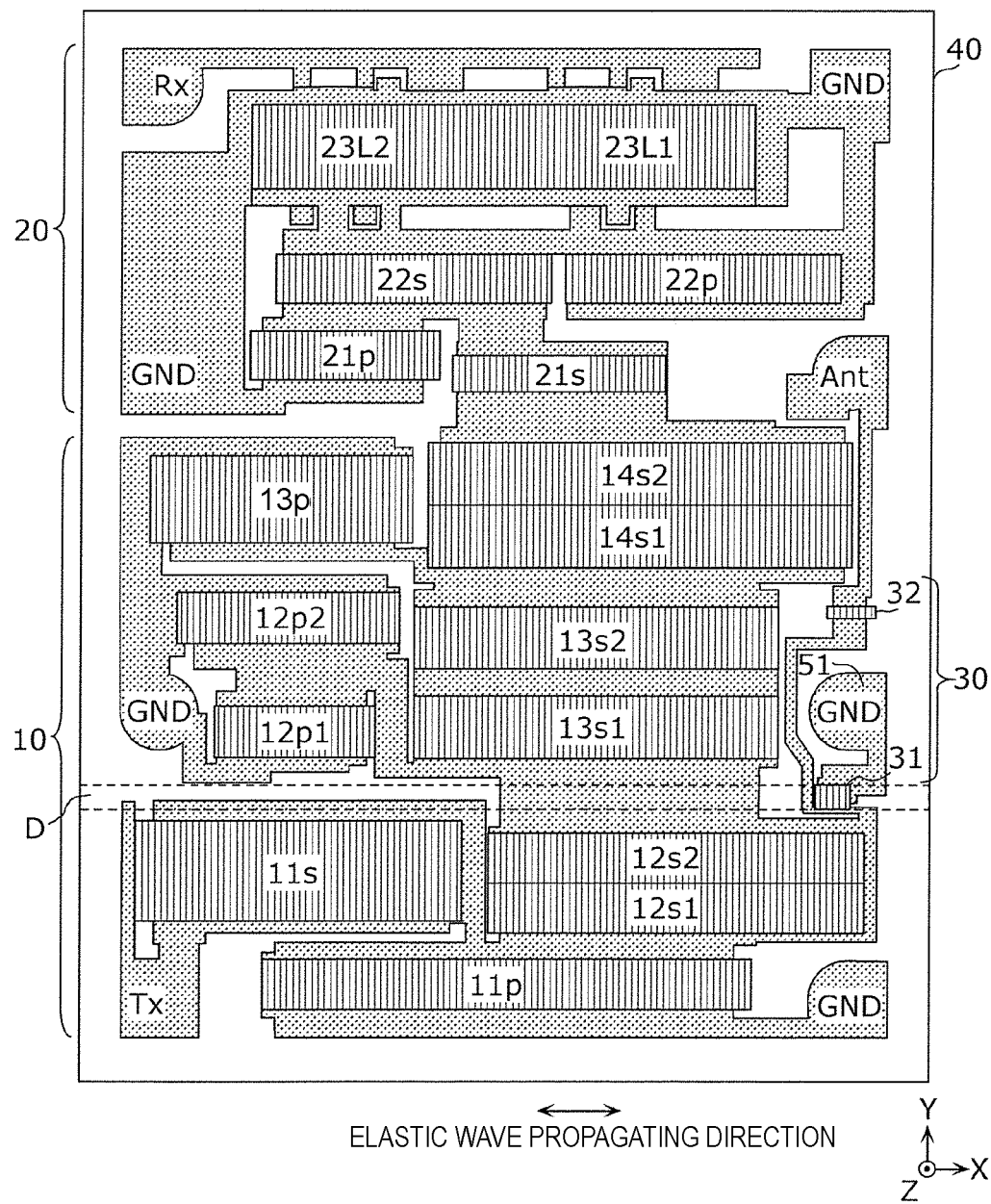
FIG. 6 is a chip plan view representing an electrode layout of a multiplexer according to a preferred embodiment of the present invention.

FIG. 6 is a chip plan view representing an electrode layout of the multiplexer 1 according to a preferred embodiment of the present invention. As illustrated in FIG. 6, the IDT electrodes and the comb-shaped electrodes of the transmission-side filter 10, the reception-side filter 20, and the cancellation circuit 30, wiring connecting these electrodes, and external connection electrodes are arranged on a piezoelectric substrate 40. Because the elements of the multiplexer 1 are provided on the single piezoelectric substrate 40, the multiplexer 1 is provided with a wafer level package (WLP) structure.

As illustrated in FIG. 6, the IDT electrodes of the series arm resonators 11s to 14s2 and the IDT electrodes of the parallel arm resonators 11p to 13p, which are included in the transmission-side filter 10, first wiring connecting these electrodes, a transmission-side electrode Tx (transmission-side terminal 110) of the transmission-side filter 10, and a ground electrode GND are preferably provided in a lower area (in the negative direction of the Y-axis) of the surface of the piezoelectric substrate 40. Furthermore, the IDT electrodes of the longitudinally-coupled resonator 31 and the comb-shaped electrode of the capacitive element 32, which are included in the cancellation circuit 30, wiring connecting these electrodes, and a ground electrode 51 (GND) are preferably provided in the lower area (in the negative direction of the Y-axis) of the surface of the piezoelectric substrate 40.

The IDT electrodes of the series arm resonators 21s and 22s, the IDT electrodes of the parallel arm resonators 21p and 22p, and the IDT electrodes of the longitudinally-coupled resonator 23L, which are included in the reception-side filter 20, wiring connecting these electrodes, a reception-side electrode Rx (reception-side terminal 120) of the reception-side filter 20, and ground electrodes GND are preferably provided in an upper area (in the positive direction of the Y axis) of the surface of the piezoelectric substrate 40.

On the surface of the piezoelectric substrate 40, an antenna connection electrode (Ant) is preferably arranged between an area where the transmission-side filter 10 and the cancellation circuit 30 are provided and an area where the reception-side filter 20 is provided.

Here, in the multiplexer 1 according to the present preferred embodiment, as illustrated in FIG. 6, when viewed in plan of the piezoelectric substrate 40, an area D which is an extension of a SAW propagation path of the longitudinally-coupled resonator 31 in the propagating direction (X-axis direction) does not overlap with a SAW propagation path of the parallel arm resonators or a SAW propagation path of the series arm resonators included in the transmission-side filter 10 and the reception-side filter 20. Because an offset component generated by the cancellation circuit 30 has a small amplitude, if transmission paths of the longitudinally-coupled resonator 31 and the series arm resonators and the parallel arm resonators of the transmission-side filter 10 are arranged side by side, the offset component is interfered with by surface acoustic waves of the series arm resonators and the parallel arm resonators, and the phase characteristics of the offset component are influenced to deteriorate the attenuation characteristics of the transmission-side filter 10. In contrast, according to the above-described configuration, the attenuation characteristics of the transmission-side filter 10 are improved.

Although each electrode finger of the comb-shaped electrode included in the capacitive element 32 is provided in the same or substantially the same direction as the electrode fingers of the other IDT electrodes in FIG. 6, each electrode finger of the comb-shaped electrode included in the capacitive element 32 may preferably be provided in a direction that intersects the direction in which the electrode fingers of the other IDT electrodes are provided. With this configuration, the capacitive element 32 is prevented from being interfered with by an RF signal excited by the other IDT electrodes.

The plurality of IDT electrodes included in the transmission-side filter 10 are preferably defined by a first electrode film. In contrast, the first wiring connecting the plurality of IDT electrodes included in the transmission-side filter 10 is preferably defined by a multilayer body including the first electrode film and a second electrode film. Furthermore, in the cancellation circuit 30, second wiring connecting the common terminal 100, the capacitive element 32, the IDT electrodes included in the elastic wave resonators 31a and 31b, and the node N preferably has the same or substantially the same film thickness as the first electrode film.

The first wiring is preferably structured as a two-layer wiring (multilayer body) in order to provide low loss in the passband of the transmission-side filter 10. In contrast, the second wiring of the cancellation circuit 30 may preferably be structured as a single-layer wiring since no big problem is caused even when a resistance component increases, because the offset component flowing through the cancellation circuit 30 has a small amplitude. Thus, the second wiring is able to be made thinner, thus making it possible to reduce the chip size.

Figure 7:
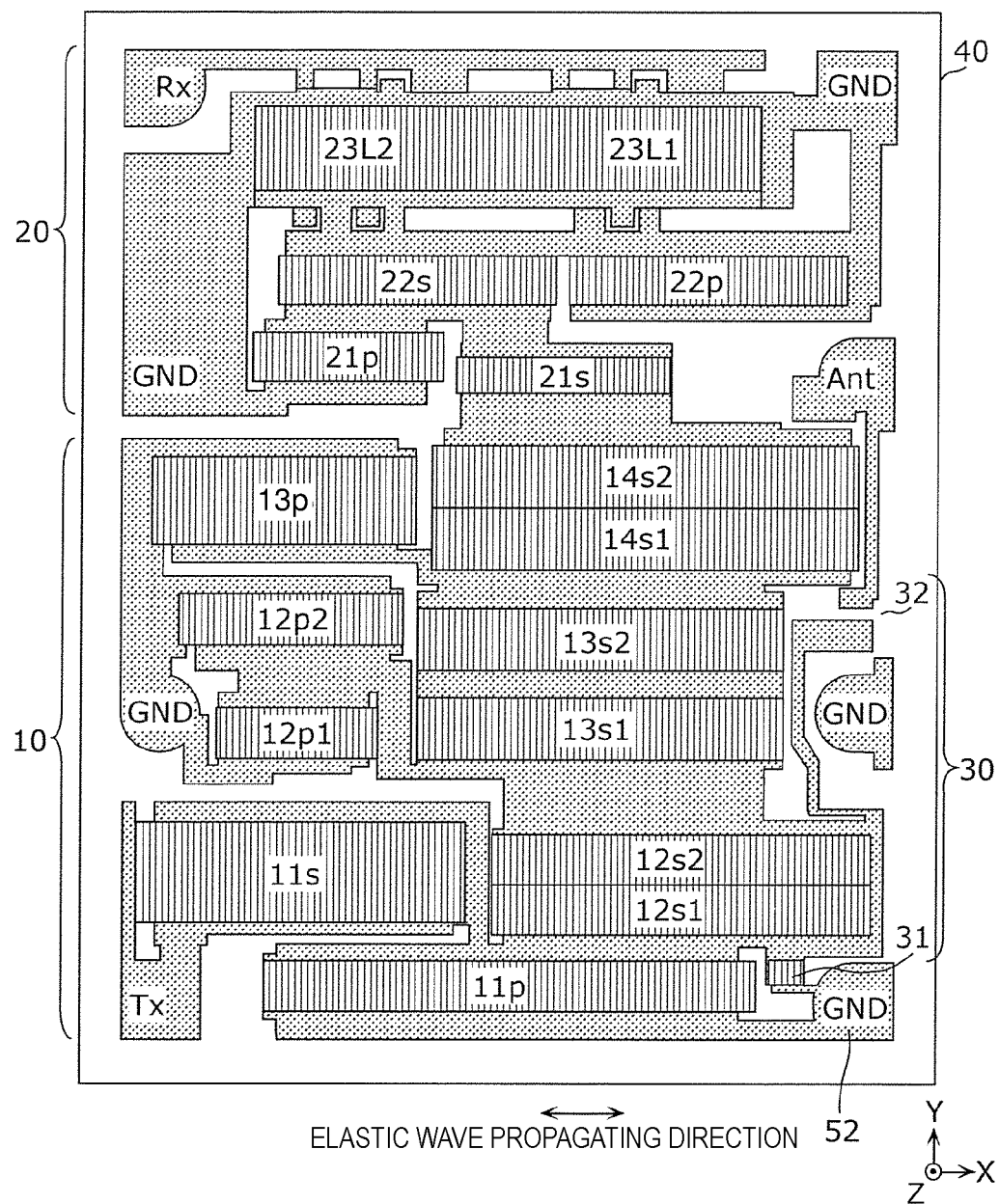
FIG. 7 is a chip plan view representing an electrode layout of a multiplexer according to a modification of a preferred embodiment of the present invention.
Figure 8:
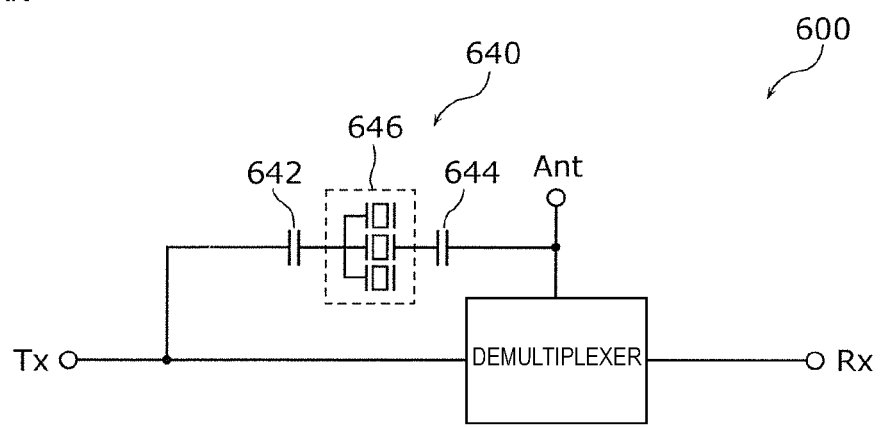
FIG. 8 is a circuit diagram of a duplexer described in Japanese Unexamined Patent Application Publication No. 2013-118611.

FIG. 7 is a chip plan view representing an electrode layout of a multiplexer according to a modification of a preferred embodiment of the present invention. The electrode layout illustrated in FIG. 7 is different from the electrode layout illustrated in FIG. 6 in the arrangement layout of the longitudinally-coupled resonator 31 and the capacitive element 32 included in the cancellation circuit 30. Hereinafter, the electrode layout according to the modification will be described by primarily discussing different points while omitting the same or similar points as the electrode layout according to the preferred embodiment illustrated in FIG. 6.

Here, in the multiplexer according to the modification, as illustrated in FIG. 7, when viewed in plan of the piezoelectric substrate 40, an area that is an extension of a SAW propagation path of the longitudinally-coupled resonator 31 in the propagating direction overlaps with a SAW propagation path of the parallel arm resonator 11p included in the transmission-side filter 10, but does not overlap with a SAW propagation path of the series arm resonators included in the transmission-side filter 10.

Because the transmission-side filter 10 is a ladder filter including series arm resonators and parallel arm resonators, the resonance point of the parallel arm resonators defines the attenuation pole on the lower frequency side of the passband (first frequency band); the anti-resonance point of the parallel arm resonators and the resonance point of the series arm resonators define the passband (first frequency band); and the anti-resonance point of the series arm resonators defines the attenuation pole on the higher frequency side of the passband (first frequency band). The resonance response of the longitudinally-coupled resonator 31 is set at the higher frequency end of the passband (second frequency band) of the reception-side filter 20. From the frequency relationship between the above-described resonance points and the anti-resonance points, the frequency of the resonance response of the longitudinally-coupled resonator 31 is closely related to the resonant frequency (anti-resonant frequency) of the series arm resonators of the transmission-side filter 10, and is distantly related to the resonant frequency (anti-resonant frequency) of the parallel arm resonators of the transmission-side filter 10.

Because an offset component generated by the cancellation circuit 30 has a small amplitude, if transmission paths of the longitudinally-coupled resonator 31 and the series arm resonators of the transmission-side filter 10 are arranged side by side, the offset component is interfered with by surface acoustic waves of the series arm resonators. In contrast, even if transmission paths of the longitudinally-coupled resonator 31 and the parallel arm resonators of the transmission-side filter 10 are arranged side by side, the offset component is unlikely to be interfered with by surface acoustic waves of the series arm resonators. Thus, according to the configuration of the modification, the degree of freedom in chip layout of the multiplexer is improved, and the attenuation characteristics of the transmission-side filter 10 are improved while reducing the chip size.

In the modification, ground wiring connected to the longitudinally-coupled resonator 31 is connected to a ground electrode 52 connected to the transmission-side filter 10 on the piezoelectric substrate 40, but is not connected to a ground electrode connected to the reception-side filter 20 on the piezoelectric substrate 40.

Accordingly, because the ground wiring connected to the longitudinally-coupled resonator 31 is connected to the ground electrode 52 connected to the transmission-side filter 10, a ground electrode is able to be shared between the longitudinally-coupled resonator 31 and the transmission-side filter 10 on the piezoelectric substrate 40, thus making it possible to reduce the chip size. In contrast, because the ground wiring connected to the longitudinally-coupled resonator 31 is not connected to a ground electrode connected to the reception-side filter 20, the resonance response of the longitudinally-coupled resonator 31 is prevented from going around and cutting into the reception-side filter 20 via the ground electrode. Accordingly, the bandpass characteristics of the reception-side filter 20 are prevented from deteriorating.

In the modification, the capacitive element 32 is not defined by a comb-shaped electrode, but is preferably defined by two wiring pieces facing each other on the piezoelectric substrate 40. Regarding the capacitive element 32, either a comb-shaped electrode or parallel plate electrodes, for example, may be appropriately selected in accordance with a required capacitance.

Although multiplexers according to preferred embodiments of the present invention have been described by using an example of a duplexer, the present invention is not limited to this example. For example, a preferred embodiment obtained by adding the following modification to the example may also be included in the present invention.

For example, the piezoelectric substrate 40 according to an example of a preferred embodiment described above may be a substrate that is at least partially piezoelectric. The substrate may preferably be a multilayer body including, for example, a piezoelectric thin film on its surface, a film with an acoustic velocity different from that of the piezoelectric film, and a support substrate. Alternatively, the substrate may be entirely piezoelectric. In this case, the substrate is preferably a piezoelectric substrate including a single piezoelectric layer.

The multiplexers according to preferred embodiments of the present invention are not limited to the Band 8 duplexer as in an example of a preferred embodiment described above. For example, the multiplexers according to preferred embodiments of the present invention may be a quadplexer that performs transmission and reception in two bands, or a multiplexer that performs transmission and reception in three or more bands. Furthermore, the multiplexers according to preferred embodiments of the present invention is applicable as a demultiplexer that has a plurality of reception frequency bands, or a multiplexer that has a plurality of transmission frequency bands.

In the above-described preferred embodiments, a SAW filter with IDT electrodes is described by way of example as the transmission-side filter, the reception-side filter, and the longitudinally-coupled resonator included in the multiplexer. However, each filter and each resonator included in the multiplexer according to preferred embodiments of the present invention may be an elastic wave filter and an elastic wave resonator using boundary acoustic waves or bulk acoustic waves (BAW). As such, the same advantageous effects as those achieved by the multiplexers according to the above-described preferred embodiments are achieved.

For example, an inductor or a capacitor may be connected between the elements of the multiplexer. The inductor may include a wiring inductor including wiring connecting the elements.

Preferred embodiments of the present invention are widely usable as low-loss and high-isolation multiplexers, which are applicable to frequency standards with multi-bands, in communication devices, such as cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common terminal, a first terminal, and a second terminal from and/or to which a radio-frequency (RF) signal is output and/or input;
a first filter circuit that has a first frequency band as a passband and that is connected to the common terminal and the first terminal;
a second filter circuit that has a second frequency band different from the first frequency band as a passband and that is connected to the common terminal and the second terminal; and
a cancellation circuit that is connected to a first node and a second node that are on a path connecting the common terminal and the first terminal, the first node being positioned closer to the common terminal, the second node being positioned closer to the first terminal, and that offsets a component in a certain frequency band flowing through the path; wherein
the cancellation circuit includes:
a capacitive element including a first end connected to the first node; and
a longitudinally-coupled resonator including a first end connected to a second end of the capacitive element, and a second end connected to the second node with no capacitive element interposed therebetween; and
an impedance in the second frequency band when viewing the cancellation circuit from the first node side is higher than an impedance in the second frequency band when viewing the cancellation circuit from the second node side.

2. The multiplexer according to claim 1, wherein the first node is the common terminal.

3. The multiplexer according to claim 1, wherein
the first frequency band is lower than the second frequency band;
the certain frequency band is included in the second frequency band; and
a frequency at which insertion loss of the longitudinally-coupled resonator is at a minimum is positioned close to the second frequency band.

4. The multiplexer according to claim 1, wherein the first filter circuit is a ladder elastic wave filter circuit including a plurality of elastic wave resonators.

5. The multiplexer according to claim 4, wherein the ladder elastic wave filter circuit includes a plurality of elastic wave resonators, a plurality of series arm resonators, and a plurality of parallel arm resonators.

6. The multiplexer according to claim 1, wherein
the first filter circuit is a transmission-side filter that propagates an RF signal from the first terminal to the common terminal;
the second filter circuit is a reception-side filter that propagates an RF signal from the common terminal to the second terminal; and
a series arm resonator is connected on the path between the first terminal and the second node.

7. The multiplexer according to claim 1, wherein
the first filter circuit is a surface acoustic wave (SAW) filter including a plurality of first interdigital transducer (IDT) electrodes provided on a piezoelectric substrate; and
the longitudinally-coupled resonator is a SAW resonator including a plurality of second IDT electrodes provided on the piezoelectric substrate.

8. The multiplexer according to claim 7, wherein the capacitive element includes a comb-shaped electrode provided on the piezoelectric substrate.

9. The multiplexer according to claim 7, wherein
the plurality of first IDT electrodes are defined by a first electrode film;
first wiring connecting the plurality of first IDT electrodes is defined by a multilayer body including the first electrode film and a second electrode film; and
second wiring connecting the first node, the capacitive element, the plurality of second IDT electrodes, and the second node have a same film thickness as the first electrode film.

10. The multiplexer according to claim 7, wherein
the first filter circuit is a ladder SAW filter including a series arm resonator and a parallel arm resonator; and
when viewed in a plan view of the piezoelectric substrate, an area that is an extension of a SAW propagation path of the longitudinally-coupled resonator in a propagating direction does not overlap with a SAW propagation path of the parallel arm resonator or a SAW propagation path of the series arm resonator.

11. The multiplexer according to claim 7, wherein
the second filter circuit is a SAW filter including a plurality of third IDT electrodes provided on the piezoelectric substrate; and
ground wiring connected to the longitudinally-coupled resonator is connected to a ground electrode connected to the first filter circuit on the piezoelectric substrate, but is not connected to a ground electrode connected to the second filter circuit on the piezoelectric substrate.

12. The multiplexer according to claim 7, wherein the longitudinally-coupled resonator includes a plurality of parallel-connected longitudinally-coupled resonators.

13. The multiplexer according to claim 12, wherein each of the plurality of parallel-connected longitudinally-coupled resonators includes five elastic wave resonators arranged along an elastic wave propagating direction.

14. The multiplexer according to claim 1, wherein the longitudinally-coupled resonator of the cancellation circuit includes two elastic wave resonators which are arranged along an elastic wave propagating direction.

15. The multiplexer according to claim 7, wherein
the longitudinally-coupled resonator of the cancellation circuit includes two elastic wave resonators which are arranged along an elastic wave propagating direction; and
each of the elastic wave resonators includes IDT electrodes provided on the piezoelectric substrate.

* * * * *